US 6,743,687 B1

(12) United States Patent
Yu

(10) Patent No.: US 6,743,687 B1
(45) Date of Patent: Jun. 1, 2004

(54) ABRUPT SOURCE/DRAIN EXTENSIONS FOR CMOS TRANSISTORS

(75) Inventor: Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/254,882

(22) Filed: Sep. 26, 2002

(51) Int. Cl.[7] .................. H01L 21/336; H01L 21/20; H01L 21/36
(52) U.S. Cl. .................. 438/303; 438/305; 438/487
(58) Field of Search .................. 438/303, 305, 438/487, 528, 530, 535, 308

(56) References Cited

U.S. PATENT DOCUMENTS 6,335,253 B1 * 1/2002 Chong et al. .......... 438/305
6,355,543 B1 * 3/2002 Yu .......................... 438/535
6,391,731 B1 * 5/2002 Chong et al. .......... 438/303
6,514,840 B2 * 2/2003 Barrett et al. .......... 438/530

* cited by examiner

Primary Examiner—John F. Niebling
Assistant Examiner—Walter L. Lindsay, Jr.

(57) ABSTRACT

Micro-miniaturized semiconductor devices having transistors with abrupt high concentration shallow source/drain extensions are fabricated by sequentially forming deep source/drain regions, pre-amorphizing intended shallow source/drain extension regions, ion implanting impurities into the pre-amorphized regions and then laser thermal annealing to crystallize the pre-amorphized regions and to activate the source/drain extensions. Embodiments include forming the deep source/drain regions using removable sidewall spacers on the gate electrode, removing the sidewall spacers, forming the ion implanted pre-amorphized source/drain exension implants, forming laser transparent oxide sidewall spacers on the gate electrode and laser thermal annealing through the oxide laser transparent sidewall spacers to selectively activate the source/drain extensions.

19 Claims, 4 Drawing Sheets

ABRUPT SOURCE/DRAIN EXTENSIONS FOR CMOS TRANSISTORS

FIELD OF THE INVENTION

The present invention relates to a method of manufacturing semiconductor devices with sub-micron dimensions. The present invention has particular applicability in manufacturing high density semiconductor devices with CMOS transistors having abrupt, highly concentrated shallow source/drain extensions.

BACKGROUND ART

The increasing demand for micro-miniaturization requires scaling down various horizontal and vertical dimensions in various device structures. As the thickness of the ion implanted source/drain junctions of transistors is scaled down, there is a corresponding scaled increase in the substrate channel doping in order to maintain a constant electric field in the transistor channel for higher speed performance. These objectives are achieved, in part, by not only forming shallow junctions but also forming source/drain extensions with an abrupt junction/dopant profile slope in proximity to the transistor channel in order to reduce penetration of the source/drain dopant into the transistor channel which occurs as the junction/profile slope becomes less abrupt. Such short channel effects result in poor threshold voltage roll-off characteristics for sub-micron devices.

As the transistor dimensions plunge into the deep sub-micron regime, it becomes increasingly more difficult to form shallow source/drain extensions with abrupt junctions and a hight impurity concentration for reduced series resistance. It also becomes increasingly more difficult to form shallow source/drain extensions without adverse dopant diffusion and deactivation.

Accordingly, there exists a continuing need for a methodology enabling the fabrication of semiconductor devices containing transistors with abrupt source/drain extension junction profiles having a high impurity concentration without dopant deactivation.

DISCLOSURE OF THE INVENTION

An advantage of the present invention is a method of manufacturing a semiconductor device comprising CMOS transistors exhibiting reduced short channel effects and having high concentration shallow, abrupt source/drain extensions without dopant deactivation.

Additional advantages and other features of the present invention will be set forth in the description which follows and, in part, will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a gate electrode, having side surfaces, over a main surface of a semiconductor substrate with a gate dielectric layer therebetween; forming first sidewall spacers on the side surfaces of the gate electrode; ion implanting to form deep source/drain implants; annealing to activate deep source/drain regions; removing the first sidewall spacers; ion implanting to form shallow pre-amorphized regions between the deep source/drain regions and the gate electrode; ion implanting impurities into the shallow pre-amorphized regions to form shallow source/drain implants; and laser thermal annealing to crystallize the shallow pre-amorphized regions to activate shallow source/drain extensions.

Embodiments of the present invention include forming an oxide liner on the side surfaces of the gate electrode and on a portion of the main surface of the semiconductor substrate, forming nitride sidewall spacers, as the first sidewall spacers, on the oxide liner, forming deep source/drain regions, forming metal silicide layers on the main surface of the semiconductor substrate over the deep source/drain regions, removing the nitride sidewall spacers and oxide liner, and then forming the shallow pre-amorphized regions and shallow source/drain implants. Embodiments of the present invention further include forming second laser transparent sidewall spacers, such as silicon oxide sidewall spacers, on the side surfaces of the gate electrode, depositing a layer of laser reflective material, such as silicon nitride, over the semiconductor substrate after forming the second laser transparent oxide sidewall spacers, planarizing, as by chemical-mechanical polishing (CMP) such that an upper surface of the silicon nitride laser reflective material is substantially coplanar with the upper surface of the silicon oxide sidewall spacers, and then impinging a laser light beam through the second silicon oxide sidewall spacers to crystallize the shallow pre-amorphized regions and to activate the source/drain extensions. In accordance with embodiments of the present invention, laser thermal annealing may be implemented by impinging a pulsed laser light beam at a radiant fluence of 0.2 to 0.8 joules/cm$^2$ for 1 to 10 nanoseconds, thereby elevating the temperature of the pre-amorphized regions to 1,200° C. to 1,300° C.

Additional advantages of the present invention will be readily apparent to those skilled in the art from the following detailed description wherein the embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, not as restrictive.

BRIEF DESCRIPTION OF THE DRAWINGS

In FIGS. 1 through 8, similar features are denoted by similar reference characters.

DESCRIPTION OF THE INVENTION

Figure 1:
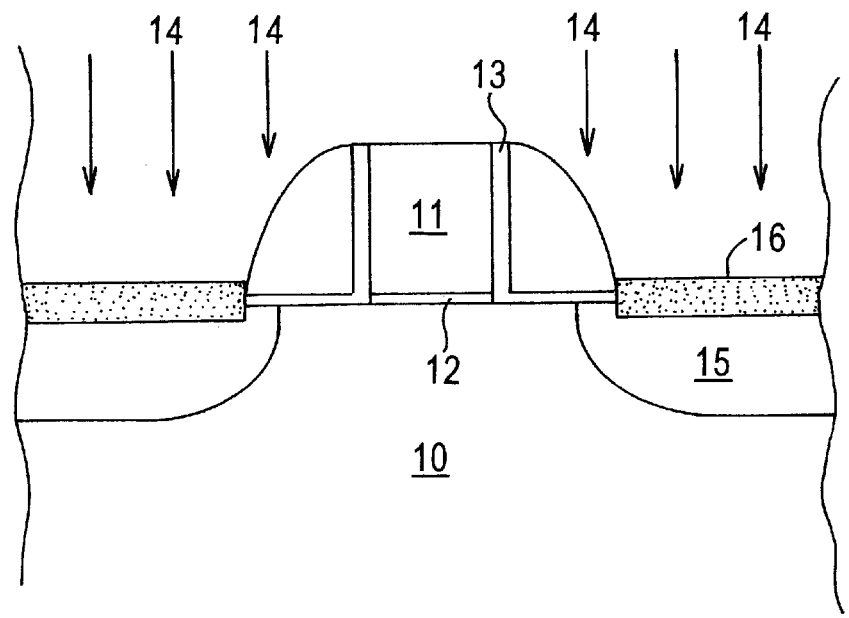
FIGS. 1 through 8 schematically illustrate sequential phases of a method in accordance with an embodiment of the present invention.

The present invention addresses and provides a solution to the problem of forming micro-miniaturized semiconductor devices having scaled down MOSFETs with significantly reduced short channel effects and reduced series resistance. This objective is achieved, in part, by forming very abrupt high concentration source/drain extensions with significantly reduced dopant deactivation by strategically employing laser thermal annealing to selectively crystallize and activate shallow pre-amorphized implanted source/drain extensions. By advantageously employing laser thermal annealing, very locally and sharply defined junction profiles are formed in an extremely short period of time without dopant diffusion. The formation of pre-amorphized regions enables accurate definition of abrupt junction profiles which are advantageously maintained as a result of laser thermal annealing without dopant diffusion. Laser thermal annealing provides rapid heating and quenching of the supersaturated pre-amorphized regions thereby preserving hight dopant concentrations.

An embodiment of the present invention is schematically illustrated in FIGS. 1 through 8. Adverting to FIG. 1, a gate electrode 11 is formed over a substrate 10, e.g., doped monocrystalline silicon, with a gate insulating layer 12 therebetweeen, e.g., silicon oxide. The gate electrode 11 typically has a width of 100 Å to 1000 Å. The gate oxide layer 12 typically has a thickness of 30 Å to 200 Å. An oxide liner 13, such as silicon oxide, is formed on the side surfaces of the gate electrode 11 and extends on a portion of the upper surface of substrate 10 on each side of gate electrode 11. Silicon oxide liner typically has a thickness of 200 Å to 600 Å. Dielectric sidewall spacers 14 are then formed on the silicon oxide liner 13. Dielectric sidewall spacers 14 typically comprise silicon nitride.

Ion implantation is then conducted, as illustrated by arrows 14, to form deep source/drain implants, followed by rapid thermal annealing such as at a temperature of 900° C. to 1,100° C. for 5 to 60 seconds, to form deep source/drain regions 15. Ion implantation 14 may be conducted before or after forming metal silicide layer 16. Metal silicide layers 16 are typically formed at a thickness of 50 Å to 200 Å and may comprise nickel silicide, cobalt silicide or titanium silicide. Metal silicide layer 16 are not formed on the upper surface of gate electrode 11. Ion implantation 14 to form deep source/drain implants may be conducted at an implantation dosage of $1 \times 10^{15}$ to $1 \times 10^{16}$ ions/cm$^2$ at an implantation energy of 10 to 30 KeV.

Figure 2:
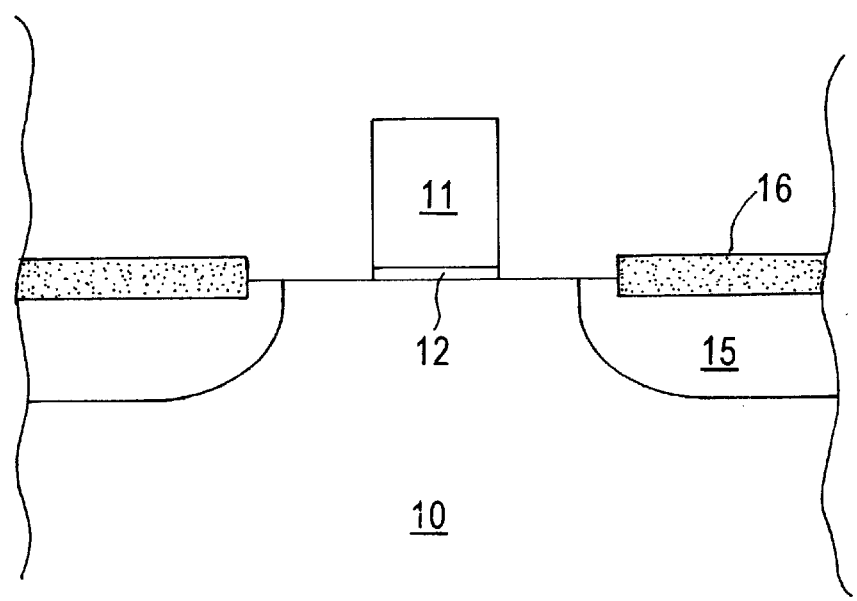

Adverting to FIG. 2, oxide liner 13 and silicon nitride sidewall spacers 14 are then removed. Silicon nitride sidewall spacers can be moved in a conventional manner using a conventional etching technique, as by etching with a boiling phosphoric acid solution. Silicon oxide liner 13 can be removed employing a conventional etching technique, as by etching with a buffered hydrofluoric acid solution. The resulting intermediate structure is illustrated in FIG. 2.

Figure 3:
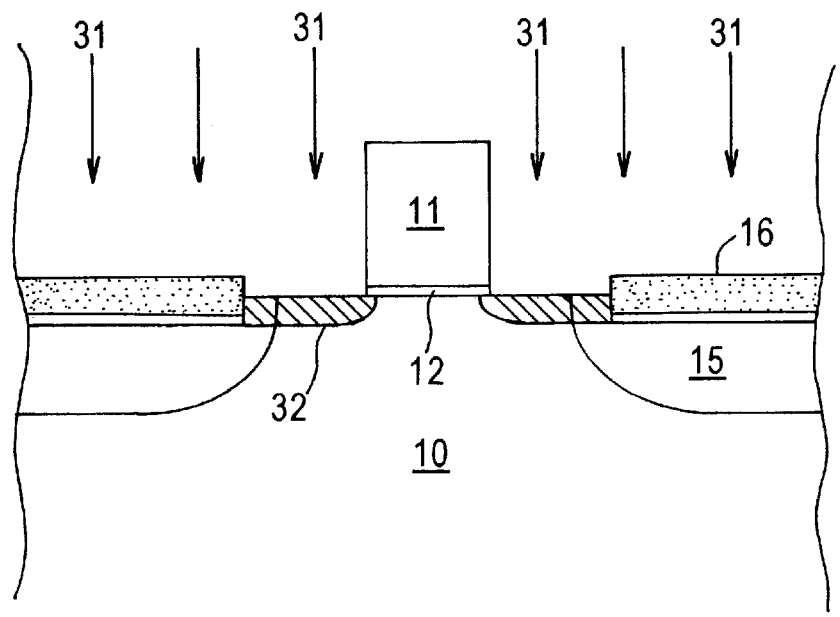

Ion implantation is then conducted, as illustrated by arrows 31 in FIG. 3, to form shallow pre-amorphized regions 32 extending between side surfaces of gate electrode 11 and deep source/drain regions 15. Shallow pre-amorphized regions 32 define the intended source/drain extensions. Ion implantation 31 to form pre-amorphized regions 32 may be implemented by ion implanting elements such as silicon (Si), germanium (Ge) or xenon (Xe). For example, Xe may be implanted at an implantation dosage of $1 \times 10^{14}$ to $5 \times 10^{14}$ ions/cm$^2$ at an implantation energy of 40 to 80 KeV to form the shallow pre-amorphized regions 32, typically having a depth of 20 Å to 40 Å from the main surface of the semiconductor substrate 10.

Figure 4:
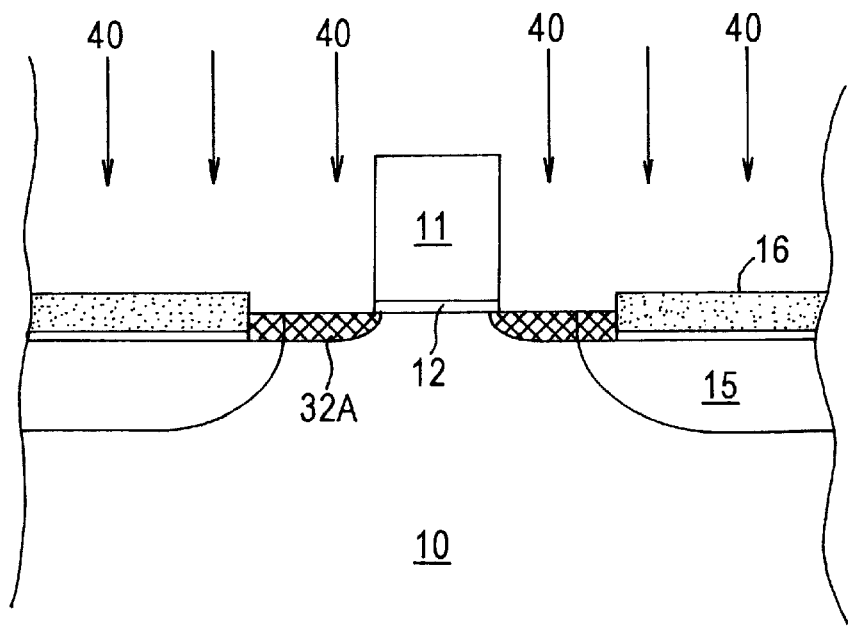

Subsequently, as illustrated in FIG. 4, ion implantation is implemented, as illustrated by arrows 40, to ion implant dopant impurities into pre-amorphized regions 32 thereby forming pre-amorphized source/drain extension implants 32A. Ion implantation 40 may be implemented by ion implanting As (for an n-channel device) at an implantation dosage of $1 \times 10^{14}$ to $1 \times 10^{15}$ ions/cm$^2$ at an implantation energy of 1 to 5 KeV.

Figure 5:
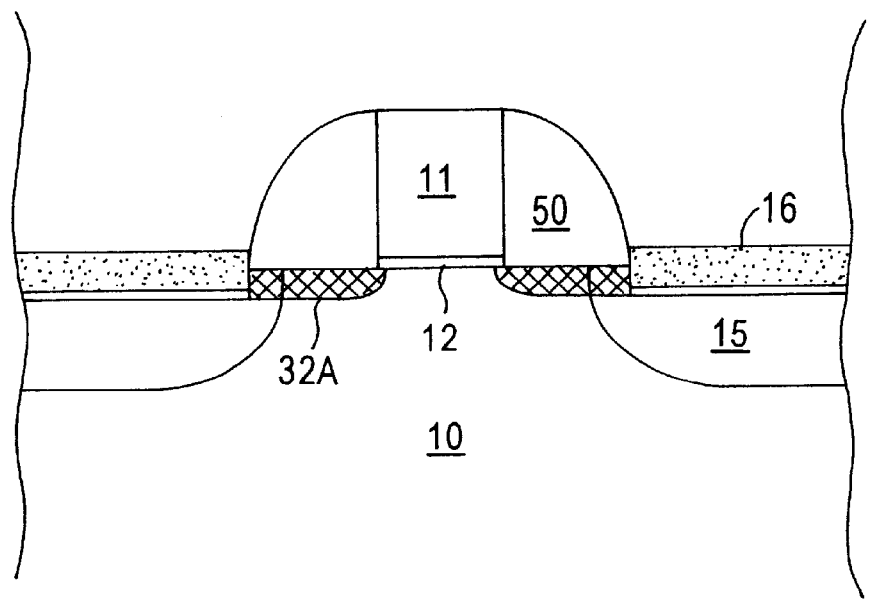

Subsequently, laser transparent dielectric sidewall spacers 50 are formed on the side surfaces of gate electrode 11, as illustrated in FIG. 5. Laser transparent sidewall spacers 50 may be formed of any laser transparent material, such as a silicon oxide. Sidewall spacers 50 are formed in a conventional manner, as by depositing a layer of silicon oxide and anisotropically etching to form sidewall spacers 50.

Figure 6:
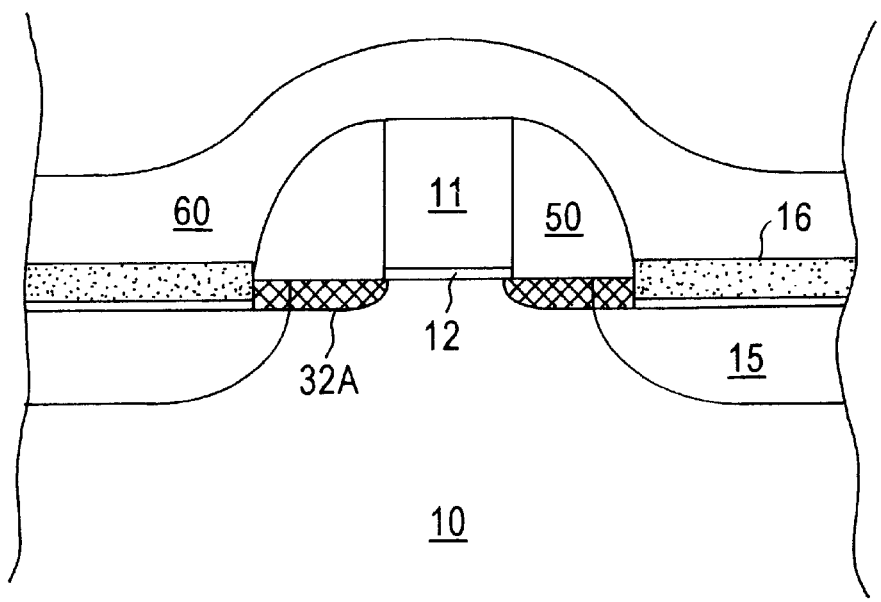
Figure 7:
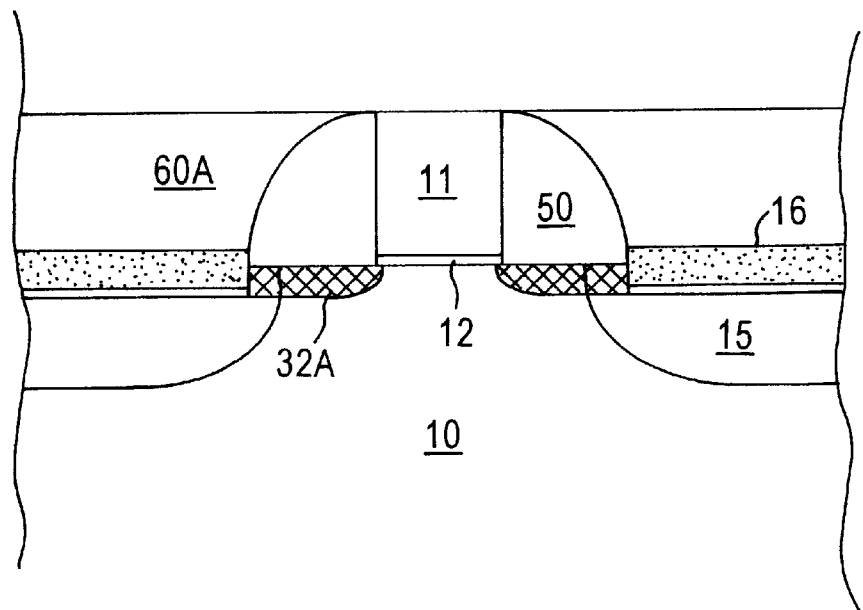

Subsequently, a layer of laser reflective material 60 is deposited over the substrate 10, gate electrode 11 and sidewall spacers 50, as illustrated in FIG. 6. Laser reflective layer 60 may comprise any laser reflective material, such as a silicon nitride. Chemical mechanical polishing (CMP) is then implemented to planarize the upper surface of layer 60 to form a planarized layer 60A, as illustrated in FIG. 7. The upper surface of planarized silicon nitride layer 60A is substantially coplanar with the upper surface of sidewall spacers 50 and gate electrode 11.

Figure 8:
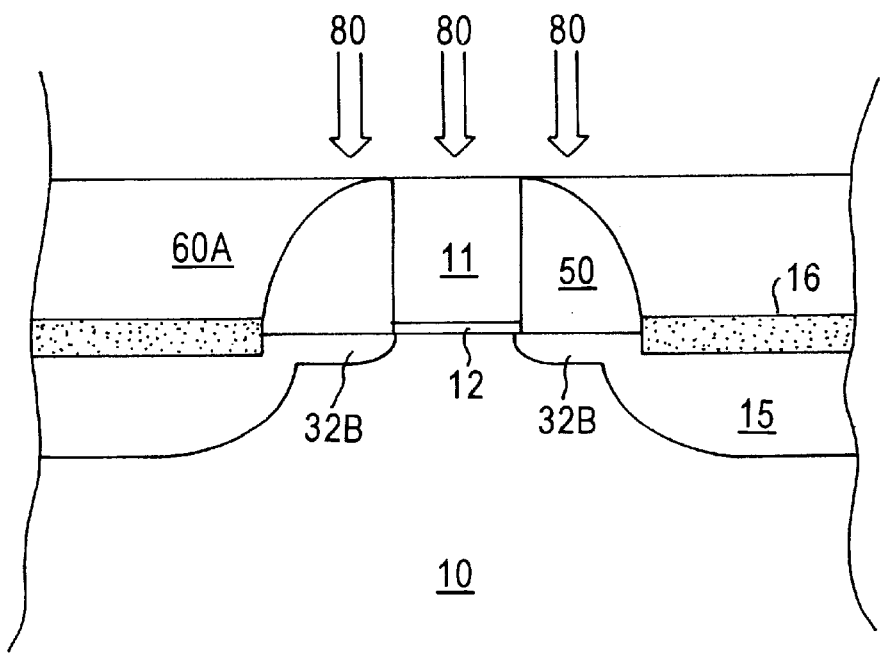

Subsequently, as illustrated in FIG. 8, laser thermal annealing is implemented, as illustrated by arrows 80, through laser transparent sidewall spacers 50, thereby selectively crystallizing and activating the shallow source/drain extension implanted pre-amorphized regions, thereby forming shallow source/drain extensions 32B. Shallow source/drain extensions 32B exhibit sharp junction profiles originally defined by pre-amorphized regions 32. The sharp junction profiles are not compromised by subsequent dopant diffusion because of the strategic implementation of laser thermal annealing which rapidly elevates the temperature of the substrate surface to 1,200° C. to 1,300° C. followed by rapid quenching. During such rapid melting and solidification, dopant diffusion is substantially prevent thereby maintaining the abrupt junction profile required for reduced series resistance. Moreover, the minimal thermal budget enables preservation of the high dopant concentration of the super-saturated pre-amorphized regions. The resuting activated shallow source/drain extension may be formed with an impurity concentration of $1 \times 10^{19}$ to $1 \times 10^{20}$ atoms/cm$^3$.

The use of a laser light beam enables pin-point accuracy in targeting the specifically defined implanted pre-amorphized regions 32 in the semiconductor substrate, thereby avoiding unnecessarily elevating the temperature of other portions of the substrate causing various problems, such as defects and diffusion issues. In implementing embodiments of the present invention, any of various commercially available laser tools may be employed, such as those utilizing a laser source capable of operating at energies of about 10 to about 2,0000 m/cm$^2$/pulse, e.g., about 100 to 400 m/cm$^2$/pulse. Commercially available tools exist which can perform such laser annealing, either with or without mask. The Verdant Technologies laser anneal tool is but an example and operates at an exposure wavelength of 308 nm.

The present invention enables the fabrication of microminiaturized semiconductor devices comprising scaled down MOSFETs with highly concentrated, sharply defined, abrupt shallow source/drain extensions and reduced dopant deactivation, thereby significantly reducing short channel effects and reducing series resistance. The present invention enjoys industrial applicability in fabricating various types of highly miniaturized semiconductor devices with improved reliability, operating speed and reproducibility. The present invention has particular applicability in fabricating semiconductor devices with design features in the deep sub-micron regime, as with a design rule less than about 0.12 micron, with significantly improved reliability and high operating speed.

In the preceding detailed description, the present invention is described with reference to specific exemplary embodiments thereof. It will, however, be evident that various modifications and changes may be made thereto, without departing from the broader scope of the present invention, as set forth in the claims. The specification and drawings are, accordingly, to be regarded as illustrative and not as restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a gate electrode, having side surfaces, over a main surface of a semiconductor substrate with a gate dielectric layer therebetween;

forming first sidewall spacers on the side surfaces of the gate electrode;

ion implanting to form deep source/drain implants;

annealing to activate deep source/drain regions;

removing the first sidewall spacers;

ion implanting to form shallow pre-amorphized regions between the deep source/drain regions and gate electrode;

ion implanting impurities into the shallow pre-amorphized regions to form shallow source/drain implants; and laser thermal annealing to crystallize the shallow pre-amorphized regions and to activate shallow source/drain extensions.

2. The method according to claim 1, comprising:

forming an oxide liner on the side surfaces of the gate electrode and on a portion of the main surface of the semiconductor substrate;

forming nitride sidewall spacers, as the first sidewall spacers, on the oxide liner;

forming the deep source/drain regions;

forming metal silicide layers on the main surface of the semiconductor substrate over the deep source/drain regions;

removing the nitride sidewall spacers and oxide liner; and forming the shallow pre-amorphized regions and shallow source/drain implants.

3. The method according to claim 1, comprising:

forming second laser transparent sidewall spacers on the side surfaces of the gate electrode; and impinging the laser light beam through the second sidewall spacers to crystallize the shallow pre-amorphized regions and to activate the source/drain extensions.

4. The method according to claim 3, comprising forming oxide sidewall spacers as the second laser transparent sidewall spacers.

5. The method according to claim 4, comprising:

depositing a layer of laser reflective material over the semiconductor substrate after forming the second laser transparent oxide sidewall spacers;

planarizing by chemical mechanical polishing (CMP); and then impinging the laser light beam to recrystallize the shallow pre-amorphized regions and to activate the shallow source/drain extensions.

6. The method according to claim 5, comprising depositing a nitride layer as the layer of laser reflective material.

7. The method according to claim 2, comprising:

forming second laser transparent sidewall spacers on the side surfaces of the gate electrode; and impinging the laser light beam through the second sidewall spacers to crystallize the shallow pre-amorphized regions and to activate the source/drain extensions.

8. The method according to claim 7, comprising forming oxide sidewall spacers as the second laser transparent sidewall spacers.

9. The method according to claim 8, comprising:

depositing a layer of laser reflective material over the semiconductor substrate after forming the second laser transparent oxide sidewall spacers;

planarizing by chemical mechanical polishing (CMP); and then impinging the laser light beam to recrystallize the shallow pre-amorphized regions and to activate the shallow source/drain extensions.

10. The method according to claim 9, comprising depositing a nitride layer as the layer of laser reflective material.

11. The method according to claim 1, comprising laser thermal annealing by impinging a laser light beam at a radiant fluence of 0.2 to 0.8 joules/cm$^2$ for 1 to 10 nanoseconds.

12. The method according to claim 11, comprising laser thermal annealing to heat the pre-amorphized regions to a temperature of 1,200° C. to 1,300° C.

13. The method according to claim 3, comprising impinging the laser light beam at a radiant fluence of 0.2 to 0.8 joules/cm$^2$ for 1 to 10 nanoseconds.

14. The method according to claim 13, comprising laser thermal annealing to elevate the temperature of the pre-amorphized regions to 1,200° C. to 1,300° C.

15. The method according to claim 7, comprising impinging the laser light beam at a radiant fluence of 0.2 to 0.8 joules/cm$^2$ for 1 to 10 nanoseconds.

16. The method according to claim 15, comprising laser thermal annealing to elevate the temperature of the pre-amorphized regions to 1,200° C. to 1,300° C.

17. The method according to claim 1, comprising conducting the recited steps sequentially in the order presented.

18. The method according to claim 1, comprising activating the deep source/drain implants by rapid thermal annealing.

19. The method according to claim 1, comprising laser thermal annealing to selectively crystallize the shallow pre-amorphized regions and activate the shallow source/drain implants.

* * * * *